United States Patent
Dube et al.

(10) Patent No.: US 7,759,213 B2
(45) Date of Patent: Jul. 20, 2010

(54) PATTERN INDEPENDENT SI:C SELECTIVE EPITAXY

(75) Inventors: Abhishek Dube, Fishkill, NY (US); Ashima B. Chakravarti, Hopewell Junction, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 12/189,344

(22) Filed: Aug. 11, 2008

(65) Prior Publication Data

US 2010/0035419 A1  Feb. 11, 2010

(51) Int. Cl.
*H01L 21/76* (2006.01)
(52) U.S. Cl. .................... 438/413; 438/494; 438/602; 257/E21.132; 257/E21.102; 257/E21.562
(58) Field of Classification Search ............ 438/413, 438/494, 602; 257/E21.132, E21.102, E21.562
See application file for complete search history.

(56) References Cited

U.S. PATENT DOCUMENTS

| | | | | |
|---|---|---|---|---|
| 7,482,068 | B2 * | 1/2009 | Ellison et al. | 428/698 |
| 2006/0141805 | A1 * | 6/2006 | Nemani et al. | 438/758 |
| 2008/0044932 | A1 * | 2/2008 | Samoilov et al. | 438/5 |

* cited by examiner

*Primary Examiner*—Michelle Estrada
(74) *Attorney, Agent, or Firm*—Scully, Scott, Murphy & Presser, P.C.; H. Daniel Schnurmann

(57) ABSTRACT

Trenches are formed in a silicon substrate by etching exposed portions of the silicon substrate. After covering areas on which deposition of Si:C containing material is to be prevented, selective epitaxy is performed in a single wafer chamber at a temperature from about 550° C. to about 600° C. employing a limited carrier gas flow, i.e., at a flow rate less than 12 standard liters per minute to deposit Si:C containing regions at a pattern-independent uniform deposition rate. The inventive selective epitaxy process for Si:C deposition provides a relatively high net deposition rate a high quality Si:C crystal in which the carbon atoms are incorporated into substitutional sites as verified by X-ray diffraction.

18 Claims, 6 Drawing Sheets

PATTERN INDEPENDENT SI:C SELECTIVE EPITAXY

FIELD OF THE INVENTION

The present invention relates to a method of forming a semiconductor structure, and particularly to a method of forming Si:C containing regions without pattern dependency of thickness by selective epitaxy.

BACKGROUND OF THE INVENTION

Silicon and carbon have a diamond crystal structure. The lattice constant of silicon is about 0.543095 nm at 300 K, and the lattice constant of carbon is about 0.356683 nm at 300 K. A Si:C region, or a carbon substituted silicon region, is a crystalline alloy of silicon and carbon in which carbon atoms occupy substitutional sites in a silicon lattice at an atomic concentration which is typically less than 5%. The Si:C region has the diamond crystal structure at a lattice constant between the lattice constant of silicon and the lattice constant of carbon.

For a carbon atomic concentration range less than 3%, high quality single crystalline Si:C regions may be formed epitaxially on a single crystalline silicon substrate as an embedded region. Such embedded Si:C regions may be employed to exert tensile stress on the surrounding portions of the silicon substrate so that silicon devices built in proximity to the embedded Si:C regions may benefit from the tensile stress generated by the embedded Si:C regions. For example, n-type field effect transistors built in a semiconductor substrate may have enhanced performance through the increase in electron mobility along some crystalline orientations under tensile stress generated by embedded Si:C regions. Typical embedded Si:C regions include embedded Si:C containing source and drain regions.

Referring to FIG. 1, an exemplary prior art semiconductor comprises a silicon substrate 108 and semiconductor structures thereupon. Specifically, the exemplary prior art semiconductor structure comprises a nested device region N and an isolated device region I. The nested device region N comprises an array of nested gate lines separated by a distance comparable to the gate length of the gate lines in the nested device region N. Each gate line in the nested device region N comprises a vertical stack of a gate dielectric 130, a gate electrode 132, and a dielectric gate cap portion 133. The width of a gate dielectric 130 in the nested device region N in the vertical cross-sectional view of FIG. 1 is the gate length of the corresponding gate line. The isolated device region I comprises an isolated gate line separated from other gate lines or other protruding structures by a distance greater than several times the length of the gate line in the isolated device region. The gate line in the isolated device region I comprises a vertical stack of a gate dielectric 130, a gate electrode 132, and a dielectric gate cap portion 133. The width of the gate dielectric 130 in the isolated device region I in the vertical cross-sectional view in FIG. 1 is the gate length of the gate line in the isolated device region I.

Gate spacers 134 are formed on the sidewalls of gate lines (130, 132, 133) by conformal deposition of a dielectric layer, followed by an anisotropic etch that removed horizontal portions of the dielectric layer. The remaining vertical portions of the dielectric layer constitute the gate spacers 134.

Trenches are formed in the silicon substrate 108 and filled with embedded Si:C regions by selective epitaxy. Specifically, nested embedded Si:C regions 140N are formed in the nested device region N, and isolated embedded Si:C regions 140I are formed in the isolated device region I. Due to pattern dependent growth rate of selective epitaxy process that forms the embedded Si:C regions (140N, 140I), the thickness of Si:C material deposited in the nested embedded Si:C regions 140N is different from the thickness of the material deposited in the isolated embedded Si:C regions 140I. Specifically, the thickness of the Si:C material deposited in the nested embedded Si:C regions 140N, which is herein referred to as a nested embedded Si:C region thickness tn', is less than the thickness of the Si:C material deposited in the isolated embedded Si:C regions 140I, which is herein referred to as an isolated embedded Si:C region thickness ti'. The ratio of the isolated embedded Si:C region thickness ti' to the nested embedded Si:C region thickness tn' is greater than 1 when the dimensions of the gate lines (130, 132, 133) are the same across the nested device region N and the isolated device region I. While the ratio of the isolated embedded Si:C region thickness ti' to the nested embedded Si:C region thickness tn' depends on the dimensions of the gate lines (130, 132, 133) and processing parameters of the selective Si:C deposition process, the ratio is consistently substantially greater than 1 and is in the range from about 1.3 to about 1.9, and typically from about 1.45 to about 1.75.

Such differences between the isolated embedded Si:C region thickness ti' to the nested embedded Si:C region thickness tn' cause differences in the height of embedded Si:C containing source and drain regions across the nested device region N and the isolated device region I, and result in differences in device performance between field effect transistors in nested configuration and field effect transistors in isolation. In general, device parameters of an arbitrary field effect transistor having a set of intrinsic device parameters such as a gate length, a gate width, and a dopant profile become layout dependent due to the variability of the thickness of embedded Si:C regions depending on other devices located in proximity to the field effect transistor. Such layout dependency in performance increases variability in device parameters complicating design of a circuit and prediction of circuit performance by simulation.

In view of the above, there exists a need for a method for forming Si:C containing regions in a silicon substrate in which the thickness of the Si:C containing regions is substantially independent of the layout of surrounding structures, i.e., the thickness of the Si:C containing regions is substantially pattern-independent.

SUMMARY OF THE INVENTION

The present invention addresses the needs described above by providing a method of forming Si:C containing regions in a silicon substrate in a substantially pattern independent manner.

In the present invention, trenches are formed in a silicon substrate by etching exposed portions of the silicon substrate. After covering areas on which deposition of Si:C containing material is to be prevented, selective epitaxy is performed in a single wafer chamber at a temperature from about 530° C. to about 620° C. employing a limited carrier gas flow, i.e., at a flow rate less than 15 standard liters per minute to deposit Si:C containing regions at a pattern-independent uniform deposition rate. The inventive selective epitaxy process for Si:C deposition provides a relatively high net deposition rate a high quality Si:C crystal in which the carbon atoms are incorporated into substitutional sites as verified by X-ray diffraction.

According to the present invention, a method of forming a semiconductor structure is provided, which comprises:

providing a substrate having silicon-containing portions in a chamber; and concurrently flowing a carrier gas, a silicon precursor gas, and a carbon precursor gas into the chamber, wherein the carrier gas is flowed at a flow rate less than 15 standard liters per minute, wherein Si:C containing regions are formed directly on the silicon-containing portions at a substantially pattern-independent deposition rate irrespective of structural patterns around the silicon-containing portions.

In one embodiment, the method further comprises concurrently flowing another carrier gas and a silicon etchant gas into the chamber after the concurrent flowing of the carrier gas, the silicon precursor gas, and the carbon precursor gas.

In another embodiment, the method further comprises repeatedly alternating a deposition step and an etch step on the substrate in the chamber, wherein each deposition step comprises concurrent flowing of the carrier gas, the silicon precursor gas, and the carbon precursor gas into the chamber, and wherein each etch step comprises concurrent flowing of the other carrier gas and the silicon etchant gas into the chamber.

Variation of vertical thicknesses of the Si:C containing regions is less than 30%, and preferably less than 10%, of a vertical thickness of a thinnest one of the Si:C containing regions.

In yet another embodiment, the method further comprises forming trenches extending beneath a top surface of the substrate, wherein sidewalls and a bottom surface of each of the trenches constitute the silicon-containing portions. The trenches may be formed self-aligned to gate spacers, and sidewalls of the trenches may be substantially vertically coincident with outer sidewalls of the gate spacers.

BRIEF DESCRIPTION OF THE DRAWINGS

FIG. 2 corresponds to a step after formation of trenches in a substrate 8. FIG. 3 corresponds to a step after formation of nested embedded Si:C regions 40N and isolated embedded Si:C regions 40I, which have substantially the same thickness.

DETAILED DESCRIPTION OF THE INVENTION

Figure 1:
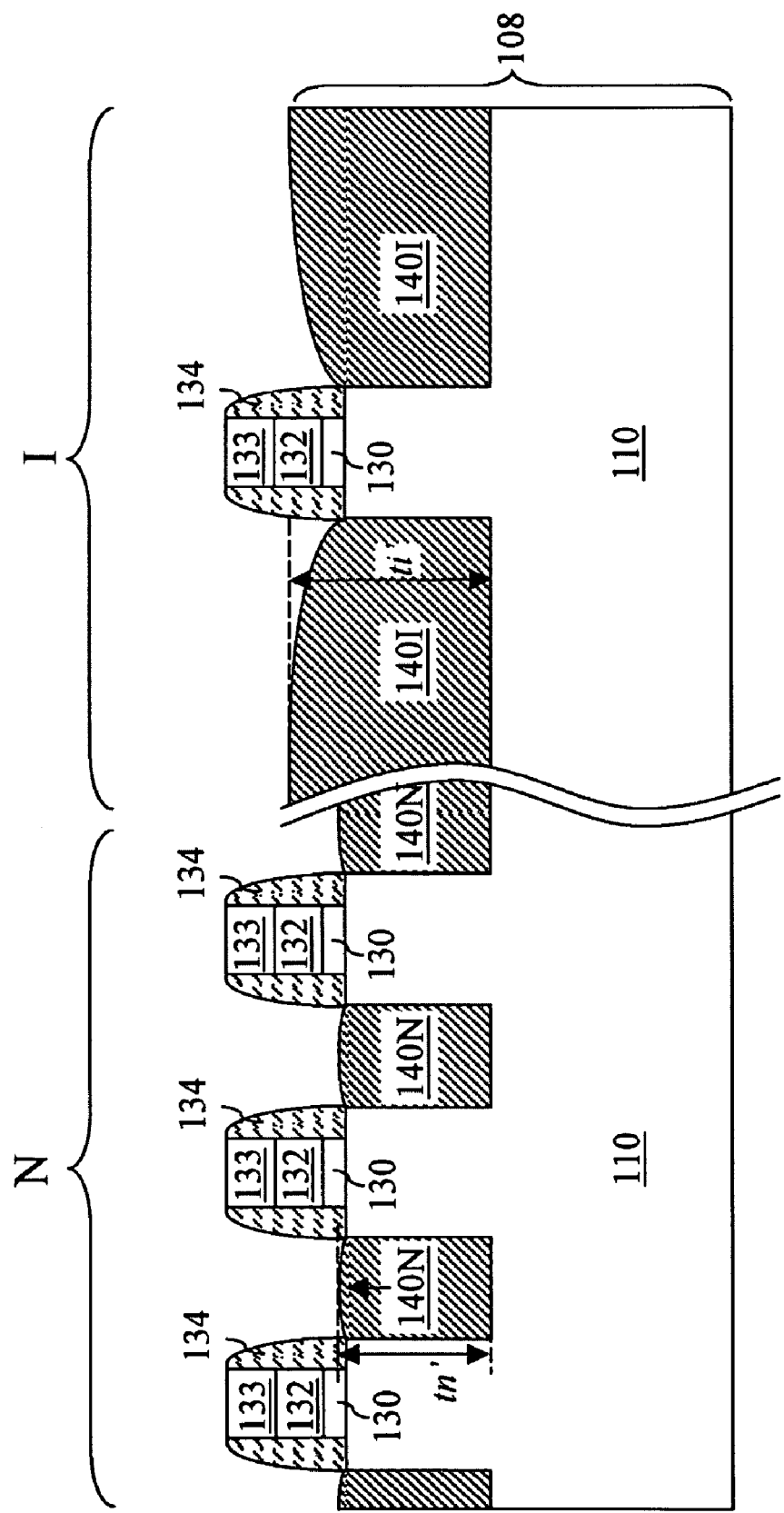
FIG. 1 is an exemplary prior art semiconductor structure comprising nested embedded Si:C regions 140N and isolated embedded Si:C regions 140I, which have different thicknesses.

As stated above, the present invention relates to a method of forming Si:C containing regions without pattern dependency of thickness by selective epitaxy, which is now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 2:
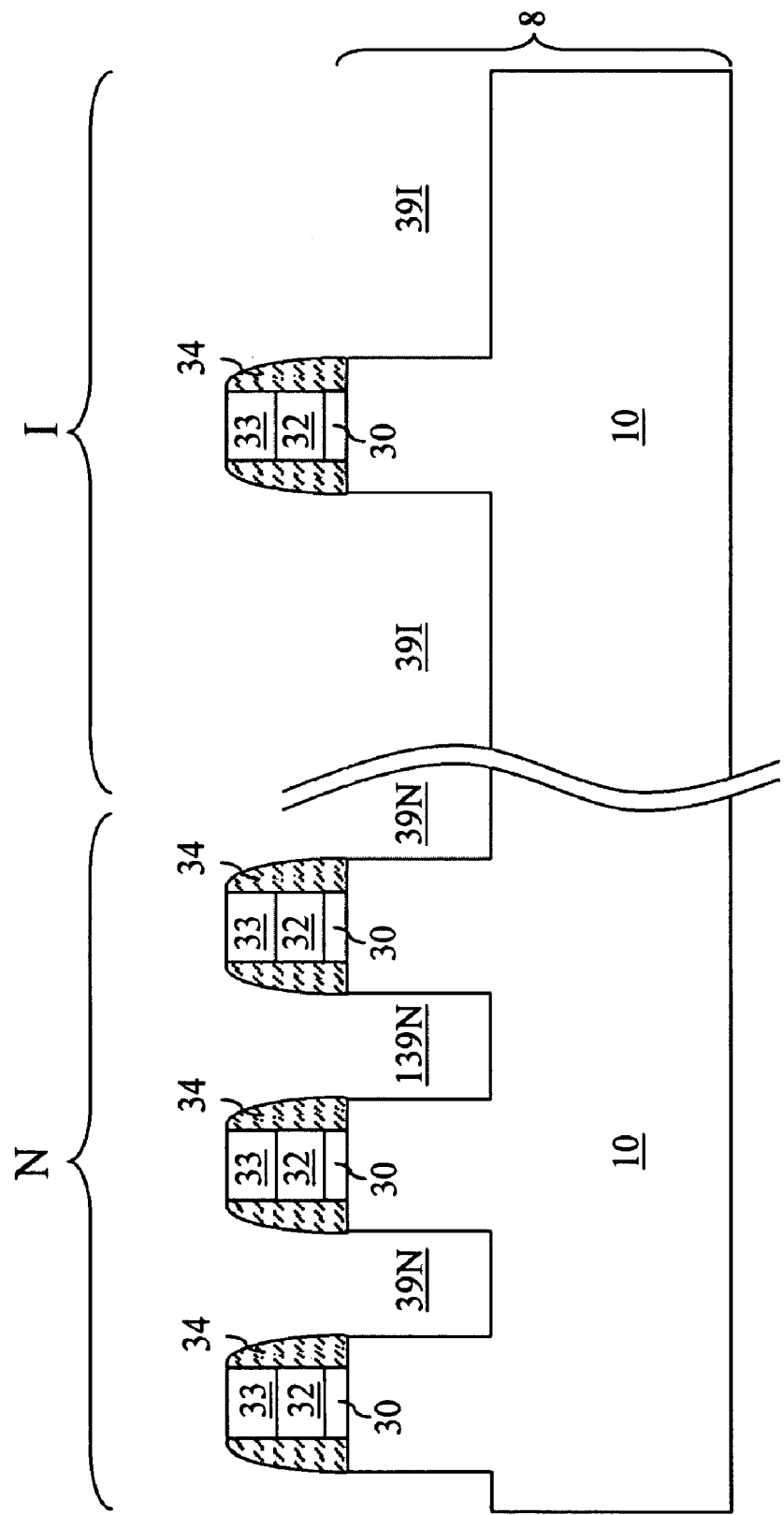
FIGS. 2 and 3 are sequential vertical cross-sectional views of a first exemplary semiconductor structure according to the present invention.

Referring to FIG. 2, a first exemplary semiconductor structure according to the present invention comprises a substrate 8 and gate structure formed thereupon. The substrate 8 is a bulk substrate which includes a silicon-containing layer 10. The silicon-containing layer 10 comprises a silicon-containing semiconductor material such as intrinsic silicon, doped silicon, an intrinsic or doped silicon germanium alloy, an intrinsic or doped silicon carbon alloy, or a combination thereof. At least a portion of the silicon-containing semiconductor material in the silicon-containing layer 10 is a single crystalline epitaxial material. Preferably, the entirety of the silicon-containing layer 10 is a single crystalline epitaxial material. The silicon-containing layer 10 may be heterogeneous, and may include graded composition regions and/or composition transition regions. Alternately, the silicon-containing layer 10 may be homogeneous. In one embodiment, the silicon-containing layer 10 consists of intrinsic silicon or doped silicon. Various doped wells (not shown) including dopants of p-type or n-type may be formed in the silicon-containing layer 10 to facilitate formation of various types of semiconductor devices.

The first exemplary semiconductor structure comprises a nested device region N and an isolated device region I. The nested device region N comprises an array of nested gate lines separated by a distance comparable to the gate length of the gate lines in the nested device region N. Each gate line in the nested device region N comprises a vertical stack of a gate dielectric 30, a gate electrode 32, and a dielectric gate cap portion 33. The width of a gate dielectric 30 in the nested device region N in the vertical cross-sectional view of FIG. 2 is the gate length of the corresponding gate line. The isolated device region I comprises an isolated gate line separated from other gate lines or other protruding structures by a distance greater than several times the length of the gate line in the isolated device region. The gate line in the isolated device region I comprises a vertical stack of a gate dielectric 30, a gate electrode 132, and a dielectric gate cap portion 33. The width of the gate dielectric 30 in the isolated device region I in the vertical cross-sectional view in FIG. 2 is the gate length of the gate line in the isolated device region I. Typical gate lengths may be from about 30 nm to about 200 nm, although lesser and greater gate lengths are also contemplated herein.

The nested device region N and the isolated device region I represent two extremes in the pattern density on a semiconductor substrate. The nested device region N represents an example of high pattern density, and the isolated device region I represents an example of low pattern density. The density pattern is the area occupied by gate structure as a fraction of the total area of the semiconductor substrate. In general, a semiconductor substrate may contain any arbitrary pattern having a pattern density between a high pattern density corresponding to the nested device region N and a low pattern density corresponding to the isolated device region.

Gate spacers 34 are formed on the sidewalls of the gate lines (30, 32, 33) by conformal deposition of a dielectric layer, followed by an anisotropic etch that removes horizontal portions of the dielectric layer. The remaining vertical portions of the dielectric layer constitute the gate spacers 34. Typical dielectric materials that may be employed for the gate spacers 34 include silicon oxide, silicon nitride, and silicon oxynitride. The lateral thickness of the gate spacers 34, as measured at the base of the gate spacers 34, may be from about 10 nm to about 200 nm, although lesser and greater lateral thicknesses are contemplated herein also.

Trenches are formed in the substrate 8 by an anisotropic etch that employs the gate spacers 34 as an etch mask. Typically, the dielectric gate cap portions 33 are also employed as an etch mask in conjunction with the gate spacers 34. Shallow trench isolation regions (not shown) that comprise a dielectric material such as silicon oxide may also be employed as an etch mask in combination with the gate spacers 34 and/or the dielectric gate cap portions 33. Optionally, an etch mask layer (not shown), which typically comprises a dielectric material, may be formed over the gate lines (30, 32, 33) and the top surface of the substrate 8 and lithographically patterned to prevent formation of trenches in a designated portion of the substrate 8.

The anisotropic etch forms trenches in the substrate 8 in regions not covered by the gate spacers 34, dielectric gate cap portions 33, shallow trench isolation regions (not shown), or an patterned etch mask layer (not shown). Nested trenches 39N are formed in the nested device region N, and isolated trenches 39I are formed in the isolated device region 39I. Typically, the depth of the nested trenches 39N is substantially the same as the depth of the isolated trenches 29I. The nested trenches 39N and the isolated trenches 39I extend downward from the top surface of the substrate 8, which abuts the bottom surfaces of the gate dielectric 30, to a depth, which is herein referred to as a trench depth. The trench depth may be from about 10 nm to about 200 nm, and typically from about 20 nm to about 100 nm, although lesser and greater trench depths are contemplated herein also. Preferably, the trench depth is the same between the nested trenches 39N and the isolated trenches 39I. Preferably, the trenches are formed self-aligned to the gate spacers 34. In this case, the sidewalls of the nested trenches 39N and the isolated trenches 39I are substantially vertically coincident with outer sidewalls of the gate spacers 34.

Figure 3:
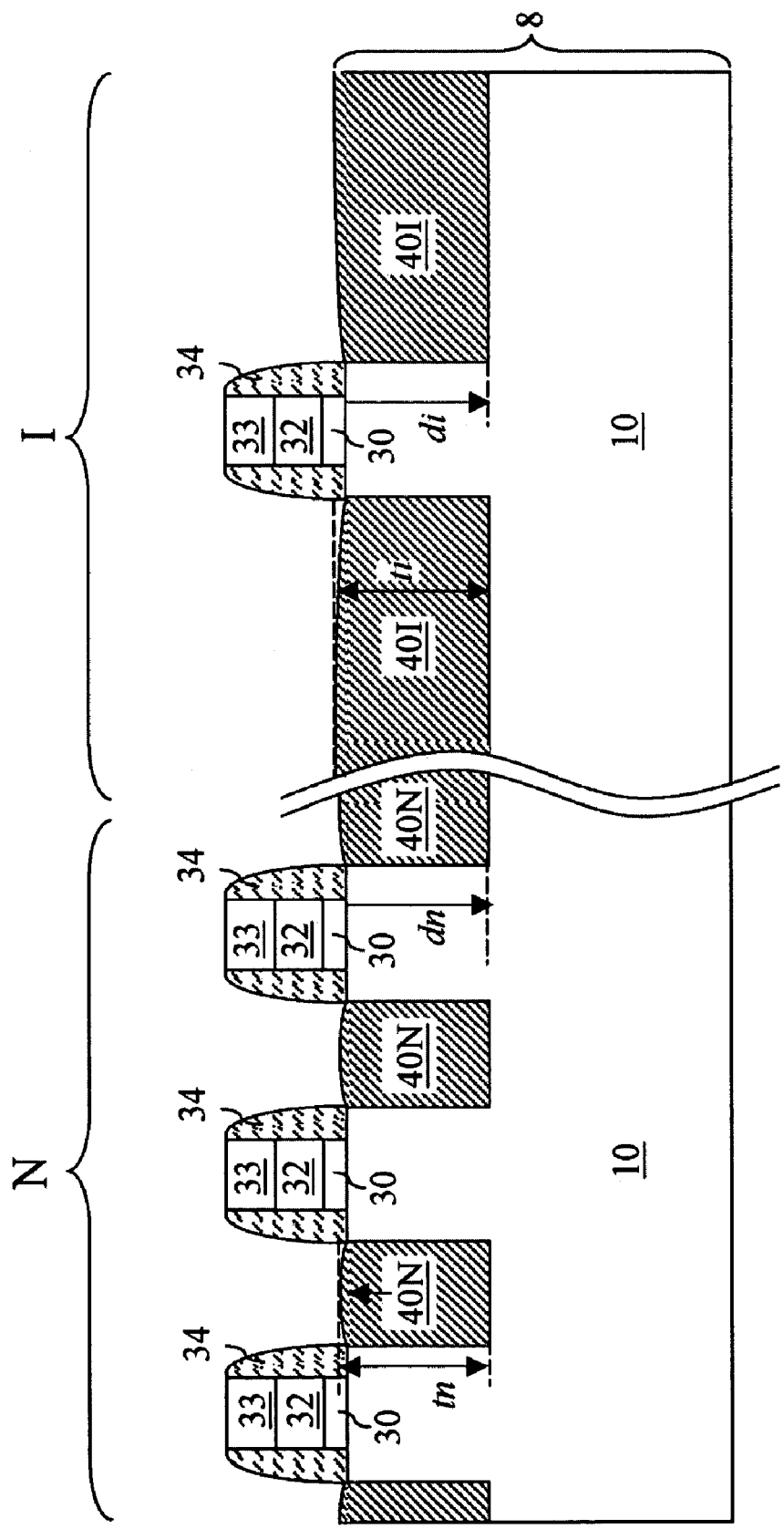

Referring to FIG. 3, selective epitaxy of Si:C according to the present invention is performed to fill the nested trenches 39N and isolated trenches 39I with a carbon substituted epitaxial silicon material, i.e., an Si:C material. Embedded Si:C regions are formed by the selective epitaxy. Specifically, nested embedded Si:C regions 40N are formed in the nested device region N, and isolated embedded Si:C regions 40I are formed in the isolated device region I. The present invention provides a substantially pattern independent deposition rate for the Si:C material so that the thickness of the Si:C material in the nested device region N is substantially the same as the thickness of the Si:C material in the isolated device region I.

The thickness of the Si:C material deposited in the nested embedded Si:C regions 40N is herein referred to as a nested embedded Si:C region thickness tn. The thickness of the Si:C material deposited in the isolated embedded Si:C regions 40I is herein referred to as an isolated embedded Si:C region thickness ti. The ratio of the isolated embedded Si:C region thickness ti to the nested embedded Si:C region thickness tn is from about 0.77 to about 1.3, and typically from about 0.9 to about 1.1, and preferably from about 0.95 to about 1.05, irrespective of the dimensions of the gate lines (30, 32, 33) in the nested device region N and the isolated device region I, irrespective of the spacing between the gate lines (30, 32, 33) in the nested device region N, and irrespective of the distance between the gate line (30, 32, 33) in the isolated device region I and any neighboring semiconductor device that protrudes above a top surface of the substrate 8. The absence or reduction of pattern dependence provided by the Si:C deposition process provided by the present invention limits variation of vertical thicknesses of the Si:C containing regions (40N, 40I) to a level less than 30% of a vertical thickness of a thinnest one of the Si:C containing regions (40N, 40I). Preferably, the variation of the vertical thicknesses of the Si:C containing regions is less than 10%, and more preferably less than 5%, of the vertical thickness of the thinnest one of the Si:C containing regions (40N, 40I).

The deposition of the Si:C material to form the nested embedded Si:C regions 40N and the isolated embedded Si:C regions 40I is effected by a selective epitaxy process. The first exemplary semiconductor structure of FIG. 2 is loaded into a chamber, which is a process chamber provided with temperature control, pressure control, and gas flow control. The process chamber may be a single wafer processing chamber provided with a susceptor configured to accommodate the first exemplary semiconductor structure. Alternately, the process chamber may be a batch processing chamber provided with a boat configured to accommodate a plurality of semiconductor substrates. Preferably, the process chamber is configured for repeated deposition and etching of the Si:C material through which the Si:C material is deposited selectively on silicon-containing semiconductor surfaces, but is not deposited on dielectric surfaces. The volume of the process chamber may be from about 0.01 m$^3$ to about 0.3 m$^3$, and typically from 0.02 m$^3$ to about 0.1 m$^3$, although lesser and greater volumes are explicitly contemplated herein.

During the deposition process, the temperature of the first exemplary semiconductor structure is maintained at a temperature from about 530° C. to about 620° C., and preferably from about 550° C. to about 600° C., and more preferably from about 570° C. to about 600° C. A first set of gases are flowed into the process chamber, while maintaining the pressure of the process chamber in the range from about 3 Torr to about 30 Torr, although lesser and greater pressures are also contemplated herein.

The first set of gas comprises a first carrier gas, a silicon precursor gas, and a carbon precursor gas. The first carrier gas may be $N_2$, Ar, He, or a combination thereof. The flow rate of the first carrier gas may be from about 1 standard liter per minute (slm) to about 9 standard liters per minute, and preferably from about 2 standard liters per minute to about 5 standard liters per minute. In one embodiment, the first carrier gas comprises $N_2$.

The silicon precursor gas is a silicon-containing gas that deposits silicon upon decomposition. Silicon precursor gases include, but are not limited to, tetrachlorosilane ($SiCl_4$), trichlorosilane ($SiHCl_3$), dichlorosilane ($SiH_2Cl_2$), silane ($SiH_4$), disilane ($Si_2H_6$), or a combination thereof. In one embodiment, a mixture of silane ($SiH_4$) and disilane ($Si_2H_6$) is employed to facilitate gas phase decomposition of the silicon precursor gases. In this case, $SiH_4$ is flowed into the process chamber at a flow rate from about 100 standard cubic centimeters per minute to about 1,600 standard cubic centimeters per minute, and $Si_2H_6$ is flowed into the process chamber at a flow rate from about 5 standard cubic centimeters per minute to about 80 standard cubic centimeters per minute. Preferably, the ratio of the flow rate of $SiH_4$ to the flow rate of $Si_2H_6$ may be from about 5 to about 80, although lesser and greater ratios are also contemplated herein.

The carbon precursor gas comprises a carbon-containing gas that dopes silicon with carbon upon decomposition. Carbon precursor gases include, but are not limited to, propane ($C_3H_8$), butane ($C_4H_{10}$), methylsilane ($CH_3SiH_3$), polymethysilane, methyltrichlorosilane ($CH_3SiCl_3$), and polysilenemethylenes (PSM). Polysilenemethylenes (PSM) contains a structure of $[-SiH_2-CH_2-]_n$, in which n is from 2 to 8, and may include branched and/or cyclic isomers. In one embodiment, the carbon precursor gas comprises methylsilane ($CH_3SiH_3$). In this case, methylsilane ($CH_3SiH_3$) is flowed into the process chamber at a flow rate from about 0.2 standard cubic centimeters per minute to about 3.2 standard cubic centimeters per minute, although lesser and greater flow rates are explicitly contemplated herein. The carbon precursor gas may be provided into the process chamber as a diluted gas in the form of a mixture with a balance gas such as $N_2$, He, Ar, etc.

The deposition process is followed by an etch process. During the etch process, the temperature of the first exemplary semiconductor structure is maintained at the same temperature as the temperature employed for the deposition process. A second set of gases are flowed into the process chamber, while maintaining the pressure of the process chamber in the range from about 3 Torr to about 30 Torr, although lesser and greater pressures are also contemplated herein.

The second set of gas comprises a second carrier gas and a silicon etchant gas. The second carrier gas may be $N_2$, Ar, He, or a combination thereof. Preferably, the second carrier gas is the same as the first carrier gas. The flow rate of the second carrier gas may be from about 2 standard liter per minute (slm) to about 6 standard liters per minute, although lesser and greater flow rates are also contemplated herein. In one embodiment, the first carrier gas and the second carrier gas comprise $N_2$.

The silicon etchant gas is a gas that etches silicon. Exemplary gases for the silicon etchant gas include, but are not limited to, HCl, $Cl_2$, $NF_3$, and combinations thereof. In one embodiment, $Cl_2$ is employed to as the silicon etchant gas. In this case, $Cl_2$ may be flowed at a flow rate from about 50 standard cubic centimeters per minute (sccm) to about 450 standard cubic centimeters per minute, although lesser and greater flow rates are also contemplated herein.

The deposition process deposits Si:C material on silicon-containing crystalline surfaces of the substrate and polycrystalline carbon doped silicon material on dielectric surfaces. The thickness of the Si:C material is greater than the thickness of the polycrystalline carbon doped silicon material since a nucleation process is required to enable deposition of the polycrystalline carbon doped silicon material on the dielectric surfaces. Since little material accumulates on the dielectric surfaces during the "incubation time," which is the time required for nucleation of the polycrystalline carbon doped silicon material on the dielectric surfaces. The incubation time may be from about 0.1 second to about 20 seconds, and typically from about 1 second and 10 seconds. Further, the growth rate of the Si:C material is typically greater than the growth rate of the polycrystalline carbon doped silicon material even after the incubation time. Such differences in the deposition rates between the Si:C material, which is deposited on silicon-containing crystalline semiconductor surfaces, and the polycrystalline carbon doped silicon material, which is deposited on dielectric surfaces, results in Si:C material portions having a greater thickness than polycrystalline carbon doped silicon material portions.

The etch process removes the semiconductor material from the Si:C material portions and the polycrystalline carbon doped silicon material portions. Typically, the removal rates are substantially the same across the Si:C material portions and the polycrystalline carbon doped silicon material portions. Since the thickness of the Si:C material portions is greater than the thickness of the polycrystalline carbon doped silicon material portions, the polycrystalline carbon doped silicon material portions may be completely removed before the entirety of the Si:C material portions is removed. By controlling the processing parameters such as the etchant flow, the duration of the etch, the etch process temperature, and the etch process pressure, the etch process may remove the entirety of the polycrystalline carbon doped silicon material portions, while preserving a fraction of each of the Si:C material portions.

Preferably, the duration of the deposition process and the duration of the etch process are optimized so that polycrystalline carbon doped silicon material does not accumulated on the dielectric surfaces, while Si:C material portions are formed on silicon-containing crystalline surfaces such as the sidewalls and bottom surfaces of the nested trenches 39N and the isolated surfaces 39I.

Further, the deposition process and the etch process may be repeatedly performed to periodically remove any polycrystalline carbon doped silicon material from dielectric surfaces. Such periodic removal of the polycrystalline carbon doped silicon material results in enhancement of net deposition rate since deposition of the polycrystalline carbon doped silicon material is retarded by the incubation time after every such removal of the polycrystalline carbon doped silicon material. During the repeated alternation of a deposition step and an etch step on the first exemplary semiconductor structure in the process chamber, each deposition step comprises concurrent flowing of the first carrier gas, the silicon precursor gas, and the carbon precursor gas into the process chamber, and each etch step comprises concurrent flowing of the second carrier gas and the silicon etchant gas into the process chamber.

Typical duration of each deposition step may be from about 3 second to about 48 seconds, and typical duration of each etch step may be from about 2.5 second to about 40 seconds, although lesser and greater duration for a deposition step and/or an etch step is also contemplated herein. Average deposition rate of a combination of a deposition step and an etch step may be from about 6 nanometers per minute to about 40 nanometers per minute, and typically from about 10 nanometers per minute to about 20 nanometers per minute. Such average deposition rate is greater than typical deposition rate known in the art, which is less than about 3 nanometers per minute.

The Si:C material portions, i.e., the Si:C containing regions such as the nested embedded Si:C regions 40N and the isolated embedded Si:C regions 40I, are single crystalline and contains carbon at an atomic concentration from about 0.01% to about 3.0 percent, and typically from about 0.1% to about 2.0%.

According to the present invention, carbon is located in substitutional sites of Si:C lattice in the Si:C containing regions, and interstitial sites of the Si:C containing regions are substantially free of carbon. In other words, the deposition process deposits the Si:C material, which is the carbon substituted silicon material in which the carbon atoms substitutionally replace silicon atoms in a crystalline structure, i.e., the carbon atoms are placed instead of silicon atoms at the crystal lattice sites. Formation of such Si:C material by selective epitaxy is not obvious, since the tendency of carbon atoms in prior art selective epitaxy of carbon containing silicon material results in incorporation of carbon in interstitial sites in which the carbon atoms are not incorporated in substitutional sites, i.e., at lattice sites of a silicon crystal, but in interstitial sites, i.e., between lattice sites of the silicon crystal.

Incorporation of carbon in substitutional sites as opposed to interstitial sites has an advantage of effectively reducing lattice constant of embedded Si:C containing regions such as the nested embedded Si:C regions 40N and the isolated embedded Si:C regions 40I. In this regard, it is noted that interstitial carbons do not alter the lattice constant of a carbon-containing silicon crystal since the lattice constant of a crystal is determined by the size of the atoms in the crystalline lattice, and is substantially unaffected by the material in interstitial sites. By forming embedded Si:C containing regions, which comprises carbon substitutes silicon material, as opposed to carbon containing silicon material in which carbon is located in interstitial sites as provided in prior art epitaxy methods, the present invention enables application of a high level of stress by the embedded Si:C containing regions to semiconductor regions surrounding the embedded Si:C containing regions. For example, a field effect transistor channel located between a pair of nested embedded Si:C regions 40N or a pair of isolated embedded Si:C regions 40I may be subjected to a lateral tensile stress, which may be advantageously employed to enhance mobility and on-current of the field effect transistor.

Further, the present invention provides a growth rate that is pattern independent. As described above, the variation of vertical thicknesses of the various embedded Si:C containing regions, i.e., the nested embedded Si:C regions 40N and the isolated embedded Si:C regions 40I, is less than 30% of a minimum vertical thickness of the various embedded Si:C containing regions, i.e., less than 30% of the thickness of the thinnest of the various embedded Si:C containing regions. Employing the exemplary process conditions, variations less than 10% may be routinely achieved. Preferably, the process conditions are optimized to effect a variation range that is less than 5% of the thickness of the thinnest of the various embedded Si:C containing regions. The deposition rate, which is directly proportional to the thickness of the embedded Si:C containing regions, is thus substantially pattern-independent across the substrate. Such uniformity, i.e., pattern-independence, in the thickness of the various embedded Si:C containing regions enables formation of semiconductor devices, e.g., field effect transistors, that provide uniform device characteristics that are independent of placement of the semiconductor devices and the layout of the surrounding semiconductor devices.

Figure 4:
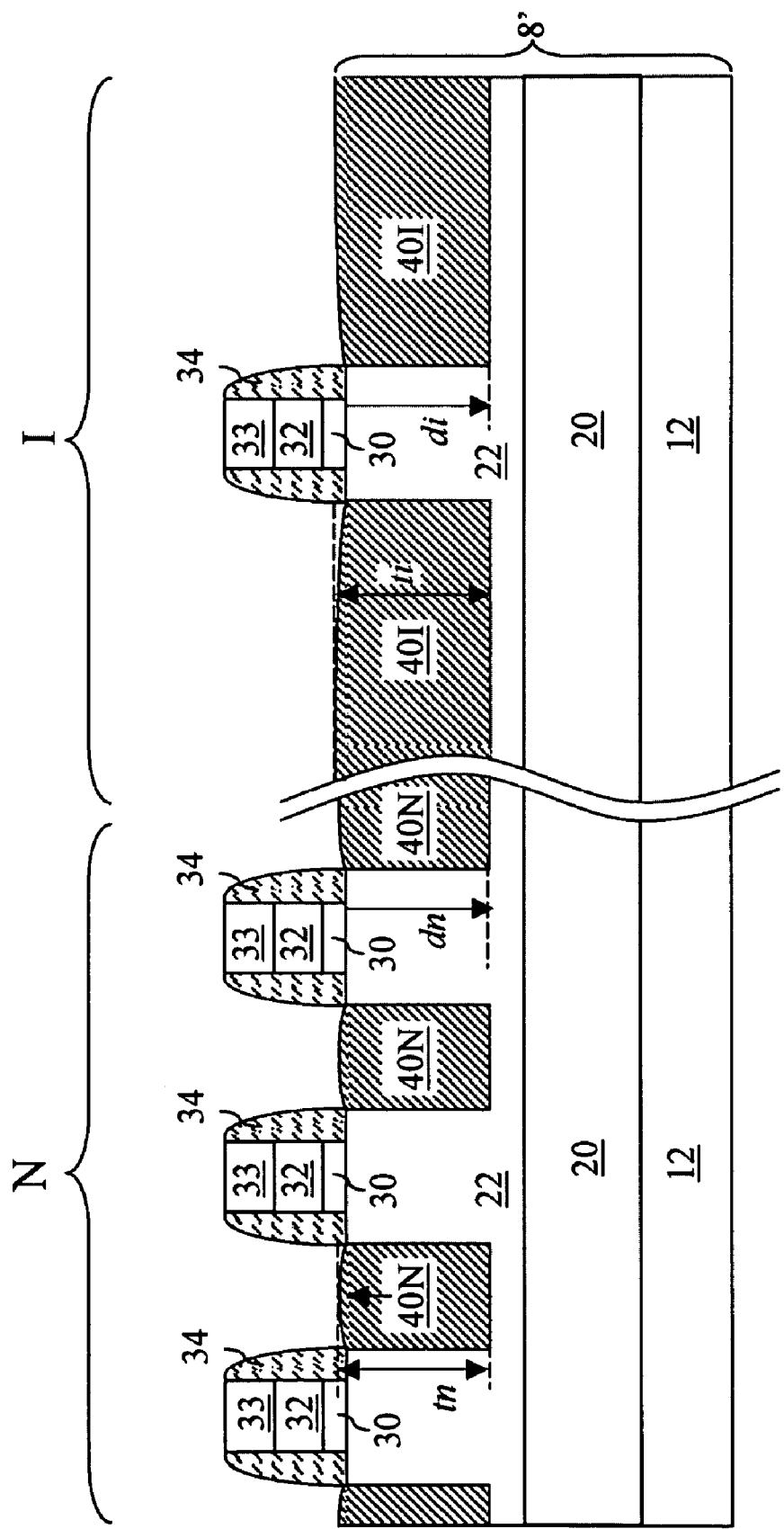
FIG. 4 is a vertical cross-sectional view of a second exemplary semiconductor structure according to the present invention.

The present invention may be practiced on semiconductor-on-insulator (SOI) substrates or hybrid substrates containing at least one bulk portion and at least one semiconductor-on-insulator portion. Referring to FIG. 4, a second exemplary semiconductor structure according to the present invention comprises a substrate 8' and gate structure formed thereupon. The substrate 8' is a semiconductor-on-insulator (SOI) substrate which includes a bottom semiconductor layer 12, a buried insulator layer 20, and a top silicon-containing layer 22. The top silicon-containing layer 22 comprises a silicon-containing semiconductor material such as intrinsic silicon, doped silicon, an intrinsic or doped silicon germanium alloy, an intrinsic or doped silicon carbon alloy, or a combination thereof. At least a portion of the silicon-containing semiconductor material in the top silicon-containing layer 22 is a single crystalline epitaxial material. Preferably, the entirety of the top silicon-containing layer 22 is a single crystalline epitaxial material. The top silicon-containing layer 22 may have the same composition as the silicon-containing layer 10 of the first exemplary semiconductor structure. Nested trenches and isolated trenches having a depth that does not exceed the thickness of the top silicon-containing layer 22 may be formed and filled with embedded Si:C containing regions as in the first exemplary semiconductor structure of FIG. 3. The same processing steps may be employed as described above.

Figure 5:
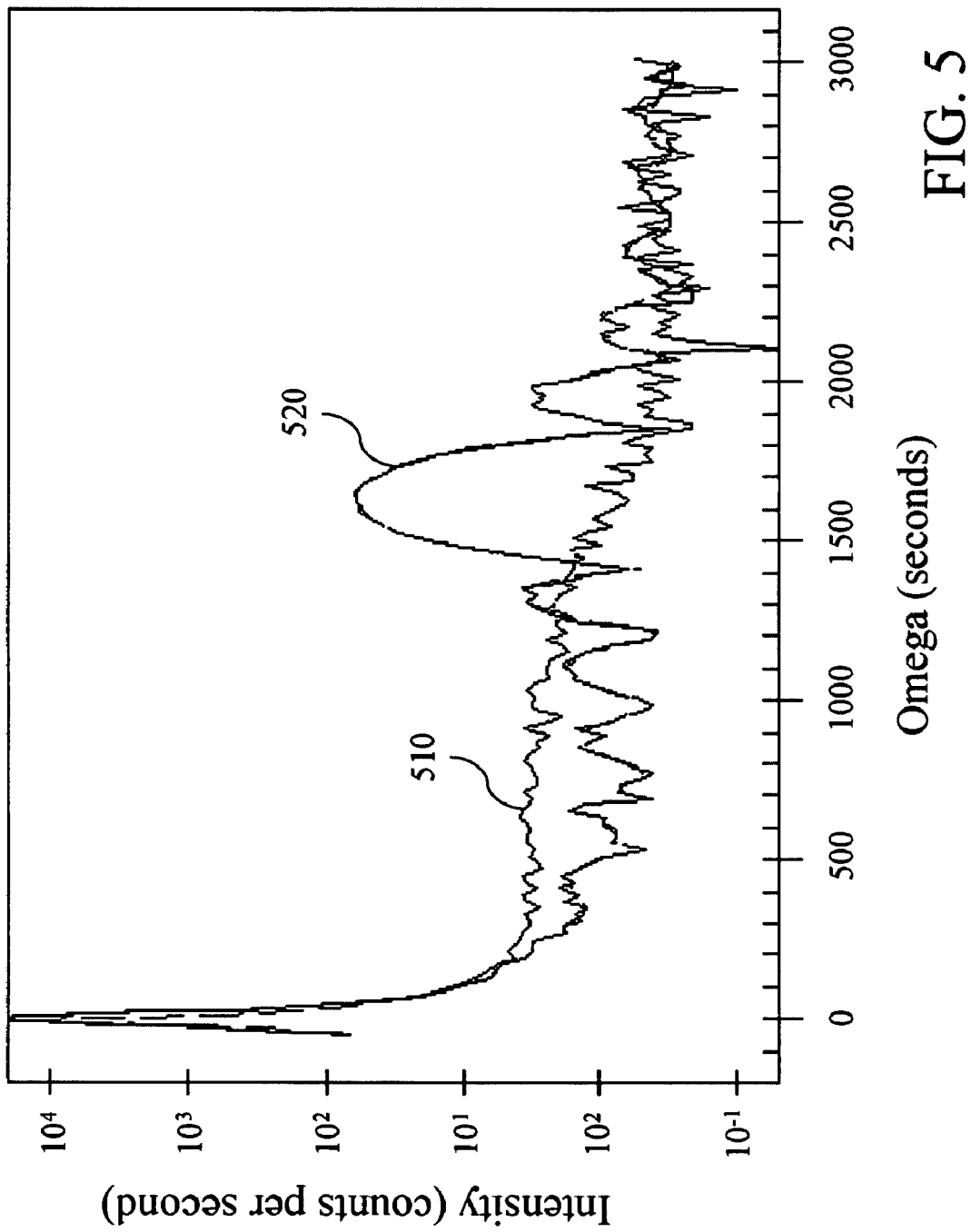
FIG. 5 shows rocking curves from X-ray diffraction for two carbon-containing silicon films. A first X-ray rocking curve 510 is from a carbon-containing silicon film grown by prior art deposition methods. A second X-ray rocking curve 520 is from an inventive Si:C containing film grown employing the deposition method of the present invention.

FIG. 5 shows two rocking curves from X-ray diffraction for a prior art carbon-containing silicon film deposited on a silicon substrate and a Si:C containing film on another silicon substrate formed by deposition methods according to the present invention. The prior art carbon-containing silicon film was deposited by prior art deposition methods employing 26 standard liters per minute (slm) of $N_2$ as the first carrier gas, a mixture of 400 standard cubic centimeter per minute (sccm) of $SiH_4$ and 20 standard cubic centimeter per minute (sccm) of $Si_2H_6$ as the silicon precursor gas, and 0.8 standard cubic centimeter per minute (sccm) of $CH_3SiH_3$ as the carbon precursor gas at 590° C. at 10 Torr. In contrast, the Si:C containing film was deposited by the inventive deposition method employing 3 standard liters per minute (slm) of $N_2$ as the first carrier gas, a mixture of 400 standard cubic centimeter per minute (sccm) of $SiH_4$ and 20 standard cubic centimeter per minute (sccm) of $Si_2H_6$ as the silicon precursor gas, and 0.8 standard cubic centimeter per minute (sccm) of $CH_3SiH_3$ as the carbon precursor gas at 590° C. at 10 Torr. The etch steps employed 4 standard liters per minute (slm) of $N_2$ as the second carrier gas and 150 standard cubic centimeter per minute (sccm) of $Cl_2$ as the silicon etchant gas at 590° C. at 10 Torr for formation of the prior art carbon-containing silicon film and the Si:C containing film according to the present invention.

The difference in the flow rate of the first carrier gas caused significant structural differences between the prior art carbon-containing silicon film and the Si:C containing film according to the present invention. Specifically, the first X-ray rocking curve 510 from the carbon-containing silicon film grown by the prior art deposition method shows that the lattice constant of the carbon-containing silicon film is substantially the same as the lattice constant of unstained silicon. Thus, the carbon-containing silicon film grown by the prior art deposition method does not apply a high level of lateral stress as an embedded film. Further, the broad plateau in the intensity in the rocking angle, omega, from about 300 seconds to about 1200 seconds show that carbon is incorporated at interstitial sites, but not at substitutional sites, in the carbon-containing silicon film grown by the prior art deposition method. Fitting of the data from the first X-ray rocking curve 510 with a model shows that there is virtually no carbon in substitutional sites in the carbon-containing silicon film grown by the prior art deposition method.

In contrast, the second X-ray rocking curve 520 from the inventive Si:C containing film grown employing the deposition method of the present invention shows a peak at about 1650 seconds in the rocking angle, omega. Such a peak and the satellite peaks thereabout show that the lattice constant of the inventive Si:C containing film is different from the lattice constant of unstrained silicon in the silicon substrate. Fitting of the data from the second X-ray rocking curve 520 with a model shows that the inventive Si:C containing film contains about 1.45 atomic percent of carbon in the substitutional sites of the inventive Si:C containing film.

Figure 6:
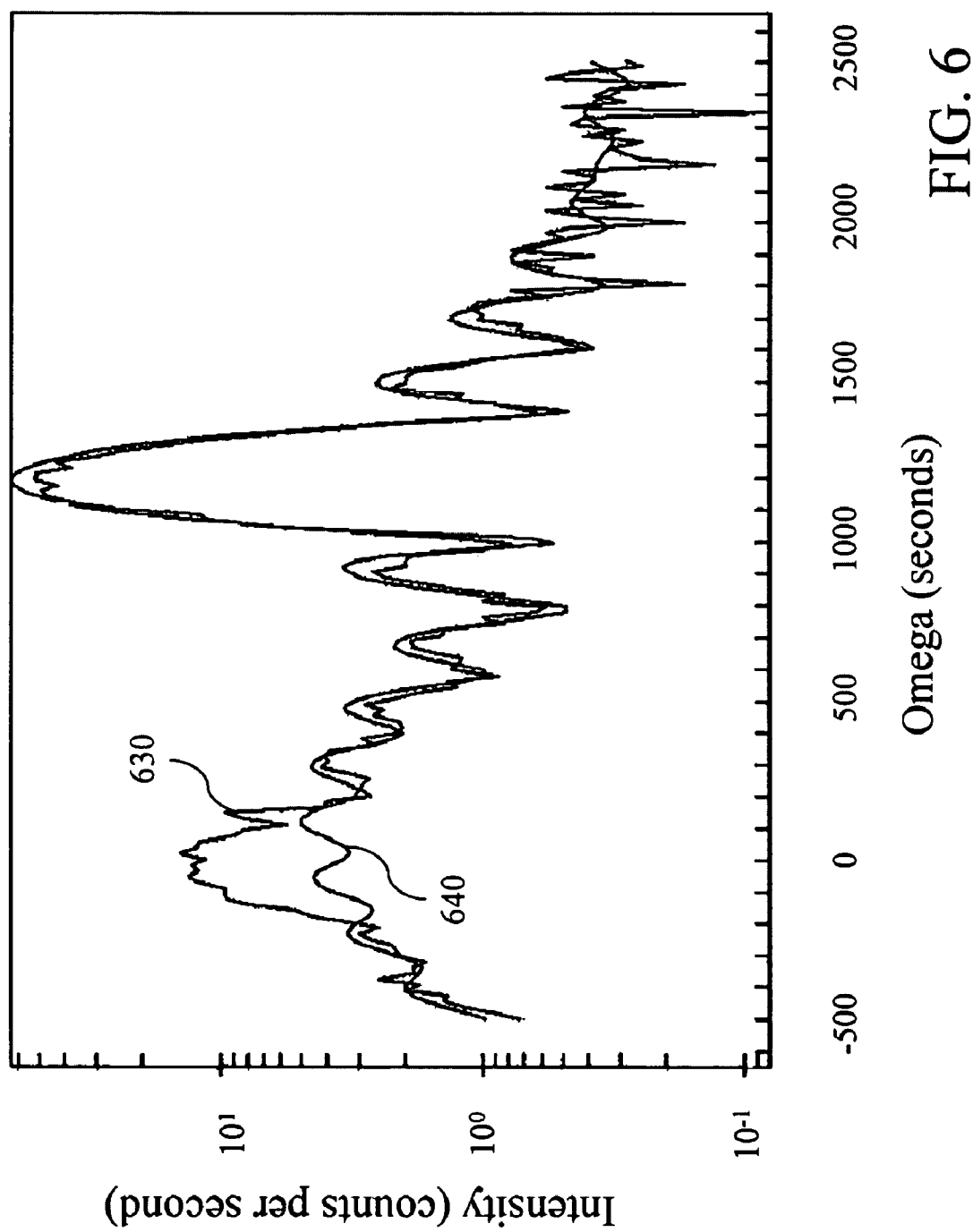
FIG. 6 shows a third X-ray rocking curve 630 for another inventive Si:C containing film grown employing the deposition method of the present invention. A fitting curve 640 shows a theoretical fit to the third X-ray rocking curve 630 to determine the content of carbon in the inventive Si:C containing film.

FIG. 6 shows a third X-ray rocking curve 630 for another inventive carbon-containing silicon film grown employing the deposition method of the present invention. A fitting curve 640 shows a theoretical fit to the third X-ray rocking curve 630 to determine the content of carbon in the inventive carbon-containing silicon film. The thickness and the atomic carbon concentration in substitutional sites as determined by the fitting curve 640 are 86 nm and 1.18%, respectively. Thus, the present invention provides Si:C regions containing carbon in substitutional sites by selective epitaxy in contrast to prior art deposition methods that generate carbon containing silicon material including carbon at interstitial sites.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   providing a substrate having silicon-containing portions in a chamber; and
   concurrently flowing a carrier gas, a silicon precursor gas, and a carbon precursor gas into said chamber, wherein said carrier gas is flowed at a flow rate less than 15 standard liters per minute, wherein Si:C containing regions are formed directly on said silicon-containing portions at a substantially pattern-independent deposition rate irrespective of structural patterns around said silicon-containing portions, and wherein said Si:C containing regions are single crystalline and contain carbon at an atomic concentration from about 0.01% to about 3.0 percent, said carbon is located in substitutional sites of a Si:C lattice in said Si:C containing regions, and wherein interstitial sites of said Si:C containing regions are substantially free of carbon.

2. The method of claim 1, wherein said silicon-containing portions consist of intrinsic silicon or doped silicon.

3. The method of claim 1, wherein said carrier gas is selected from $N_2$, Ar, He, and a combination thereof.

4. The method of claim 1, wherein said flow rate of said carrier gas is from about 1 standard liter per minute to about 9 standard liters per minute.

5. The method of claim 4, wherein said flow rate of said carrier gas is from about 2 standard liters per minute to about 5 standard liters per minute.

6. The method of claim 1, wherein pressure of said chamber is from about 3 Torr to about 30 Torr while said carrier gas, said silicon precursor gas, and said carbon precursor gas are flowed into said chamber.

7. The method of claim 1, wherein a temperature of said substrate is from about 550° C. to about 600° C. while said carrier gas, said silicon precursor gas, and said carbon precursor gas are flowed into said chamber.

8. The method of claim 1, wherein said silicon precursor gas comprises a mixture of $SiH_4$ and $Si_2H_6$.

9. The method of claim 8, wherein $SiH_4$ is flowed into said chamber at a flow rate from about 100 standard cubic centimeters per minute to about 1,600 standard cubic centimeters per minute, and $Si_2H_6$ is flowed into said chamber at a flow rate from about 5 standard cubic centimeters per minute to about 80 standard cubic centimeters per minute.

10. The method of claim 1, wherein said carbon precursor gas comprises methylsilane ($CH_3SiH_3$), and wherein methylsilane ($CH_3SiH_3$) is flowed into said chamber at a flow rate from about 0.2 standard cubic centimeters per minute to about 3.2 standard cubic centimeters per minute.

11. The method of claim 1, further comprising concurrently flowing another carrier gas and a silicon etchant gas into said chamber after said concurrent flowing of said carrier gas, said silicon precursor gas, and said carbon precursor gas.

12. The method of claim 11, wherein said other carrier gas is the same as said carrier gas, and wherein said silicon etchant gas comprises $Cl_2$.

13. The method of claim 12, wherein said other carrier gas is flowed at a flow rate from about 2 standard liters per minute to about 6 standard liters per minute, and wherein $Cl_2$ is flowed at a flow rate from about 50 standard cubic centimeters per minute to about 450 standard cubic centimeters per minute.

14. The method of claim 11, further comprising repeatedly alternating a deposition step and an etch step on said substrate in said chamber, wherein each deposition step comprises concurrent flowing of said carrier gas, said silicon precursor gas, and said carbon precursor gas into said chamber, and wherein each etch step comprises concurrent flowing of said other carrier gas and said silicon etchant gas into said chamber.

15. The method of claim 14, wherein duration of each of said deposition steps is from about 3 second to about 48 seconds, and wherein duration of each of said etch step is from about 2.5 second to about 40 seconds.

16. The method of claim 14, wherein average deposition rate of a combination of a deposition step and an etch step is from about 6 nanometers per minute to about 40 nanometers per minute.

17. The method of Claim 1, wherein variation of vertical thicknesses of said Si:C containing regions is less than 30% of a vertical thickness of a thinnest one of said Si:C containing regions.

18. The method of claim 17, wherein variation of vertical thicknesses of said Si:C containing regions is less than 10% of a vertical thickness of a thinnest one of said Si:C containing regions.

* * * * *